US012672295B2

(12) United States Patent
Lu et al.

(10) Patent No.: US 12,672,295 B2
(45) Date of Patent: Jun. 30, 2026

(54) THREE DIMENSIONAL SEMICONDUCTOR DEVICE STACK, SYSTEM HAVING THE SAME, AND METHOD OF OPERATING THREE DIMENSIONAL SEMICONDUCTOR DEVICE STACK

(71) Applicant: MACRONIX INTERNATIONAL CO., LTD., Hsinchu (TW)

(72) Inventors: Cheng-Hsien Lu, Taoyuan City (TW);
Ming-Hsiu Lee, Hsinchu City (TW);
Dai-Ying Lee, Hsinchu County (TW);
Teng-Hao Yeh, Zhubei City (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 119 days.

(21) Appl. No.: 18/766,708

(22) Filed: Jul. 9, 2024

(65) Prior Publication Data

US 2026/0020252 A1     Jan. 15, 2026

(51) Int. Cl.
*G11C 16/04*          (2006.01)
*H10B 43/27*          (2023.01)
(Continued)

(52) U.S. Cl.
CPC ......... *H10B 80/00* (2023.02); *G11C 16/0483* (2013.01); *H10B 43/27* (2023.02); *H10W 90/00* (2026.01); *H10W 90/792* (2026.01)

(58) Field of Classification Search
CPC .... H10B 80/00; H10B 43/27; G11C 16/0483; H01L 24/08; H01L 25/0657; H01L 25/18;
(Continued)

(56) References Cited

U.S. PATENT DOCUMENTS 6,377,504 B1 *  4/2002  Hilbert ................... G11C 5/063
                                              365/207
8,041,881 B2 * 10/2011  Rajan .................... G11C 11/406
                                              711/104
(Continued)

FOREIGN PATENT DOCUMENTS

TW          201025596 A      7/2010
TW          201833938 A      9/2018
(Continued)

*Primary Examiner* — Michael T Tran

(74) *Attorney, Agent, or Firm* — McClure, Qualey & Rodack, LLP

(57)          ABSTRACT

A three dimensional semiconductor device stack includes a first non-volatile memory array device, a second non-volatile memory array device, and a functional device. The first non-volatile memory array device includes a plurality of planes. The second non-volatile memory array device included a plurality of planes. The functional device is electrically connecting to the first non-volatile memory array device and the second non-volatile memory array device. The functional device includes a z-direction switch and a plane switch. The z-direction switch is configured to select one of the first non-volatile memory array device and the second non-volatile memory array device, and the plane switch is configured to select one of the planes of the selected first non-volatile memory array device or the selected second non-volatile memory array device. A method of operating the three dimensional semiconductor device stack is also disclosed.

19 Claims, 12 Drawing Sheets

(51) Int. Cl.
  *H10B 80/00* (2023.01)
  *H10W 90/00* (2026.01)
(58) Field of Classification Search
  CPC ... H01L 2224/08145; H01L 2924/1431; H01L 2924/14511
  USPC .......................................... 365/185.17, 185.24
  See application file for complete search history.

(56) References Cited

U.S. PATENT DOCUMENTS

| | | | | |
|---|---|---|---|---|
| 12,406,956 | B2 * | 9/2025 | Sharma .................... | H01L 24/32 |
| 2006/0179206 | A1 * | 8/2006 | Brittain .................... | G11C 5/04 |
| | | | | 711/105 |
| 2010/0195363 | A1 * | 8/2010 | Norman .................... | G11C 5/04 |
| | | | | 365/191 |
| 2012/0265929 | A1 * | 10/2012 | Norman ................. | G11C 16/22 |
| | | | | 711/E12.008 |
| 2015/0052415 | A1 * | 2/2015 | Um .................... | G06F 11/1048 |
| | | | | 714/768 |
| 2015/0255161 | A1 * | 9/2015 | Lee ........................ | G11C 16/16 |
| | | | | 365/185.11 |
| 2018/0330769 | A1 * | 11/2018 | Haywood ........... | G06F 11/1068 |
| 2020/0272564 | A1 * | 8/2020 | Keeth ....................... | G11C 7/10 |
| 2021/0342671 | A1 * | 11/2021 | Hoang .................... | H01L 24/05 |
| 2022/0084619 | A1 * | 3/2022 | Ning ...................... | G11C 29/42 |
| 2022/0147689 | A1 * | 5/2022 | Or-Bach ............... | G06F 30/392 |
| 2022/0188001 | A1 * | 6/2022 | Jayaraman .......... | G06F 12/0284 |
| 2022/0382488 | A1 * | 12/2022 | Das ........................ | G06F 3/0659 |
| 2022/0406813 | A1 * | 12/2022 | Gao ...................... | H10B 43/27 |
| 2024/0176700 | A1 | 5/2024 | Seo | |
| 2024/0282388 | A1 * | 8/2024 | Joo ........................ | G11C 16/102 |
| 2024/0290714 | A1 * | 8/2024 | Kraman ................ | H10B 41/27 |
| 2024/0431103 | A1 * | 12/2024 | Song ...................... | H10B 43/27 |

FOREIGN PATENT DOCUMENTS

| | | |
|---|---|---|
| TW | 201917840 A | 5/2019 |
| TW | 202114073 A | 4/2021 |
| TW | 202428133 A | 7/2024 |

* cited by examiner

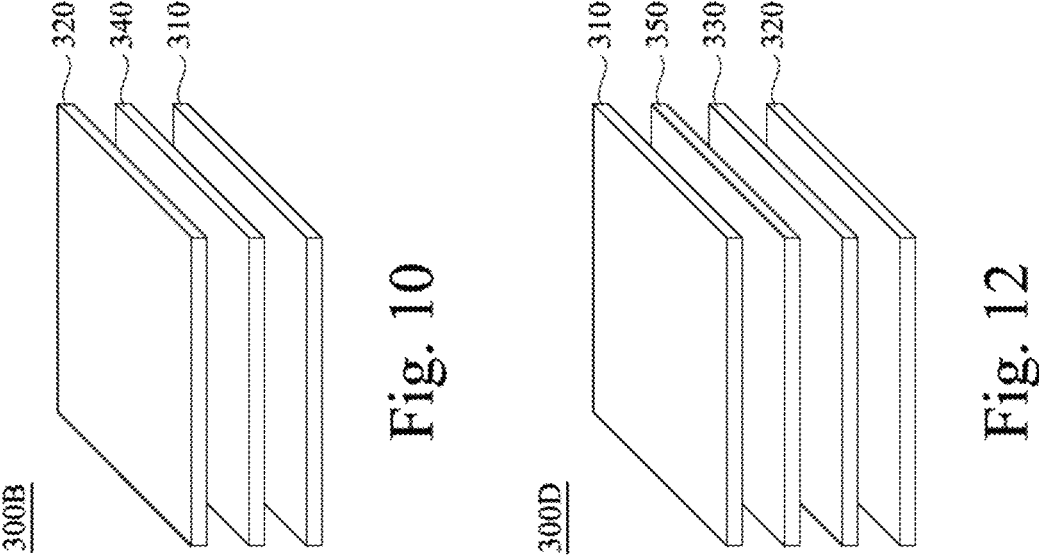
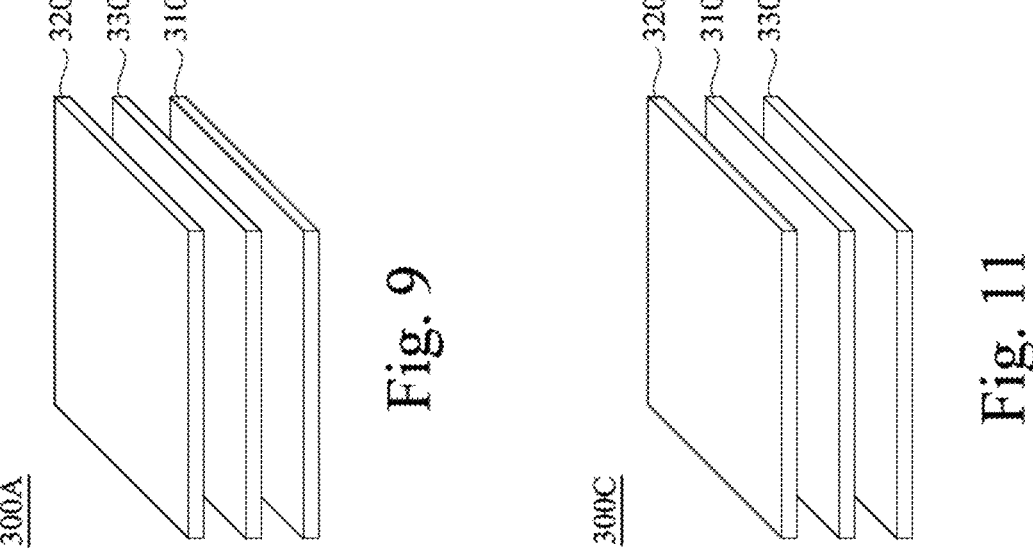

THREE DIMENSIONAL SEMICONDUCTOR DEVICE STACK, SYSTEM HAVING THE SAME, AND METHOD OF OPERATING THREE DIMENSIONAL SEMICONDUCTOR DEVICE STACK

BACKGROUND

Field of Invention

The present disclosure relates to a three dimensional semiconductor device stack, system having the same, and a method of operating the three dimensional semiconductor device stack.

Description of Related Art

In recent years, the structures of three dimensional semiconductor device stacks have been changed constantly, and the storage capacity of the devices has been increased continuously. Memory array devices are used in storage elements for many products such as digital cameras, mobile phones, computers, etc. As the application increases, the demand for the memory array device focuses on small size and large memory capacity. For satisfying the requirement, a memory array device having a high element density and a small size and the manufacturing method thereof are in need.

In order to increase a storage capacity of the memory in a limited memory volume, a three dimensional (3D) memory is developed. In some 3D memory technologies, vertical channel structures may be disposed in blocks arranged in rows. For each block, a plurality of horizontal word lines is formed by stacking planar word line layers that intersect with the vertical channel structures in the block, forming so-called gate-all-around memory cells.

SUMMARY

As aspect of the disclosure provides a three dimensional semiconductor device stack. The three dimensional semiconductor device stack includes a first non-volatile memory array device, a second non-volatile memory array device, and a functional device. The first non-volatile memory array device includes a plurality of planes. The second non-volatile memory array device included a plurality of planes. The functional device is electrically connecting to the first non-volatile memory array device and the second non-volatile memory array device. The functional device includes a z-direction switch and a plane switch. The z-direction switch is configured to select one of the first non-volatile memory array device and the second non-volatile memory array device, and the plane switch is configured to select one of the planes of the selected first non-volatile memory array device or select one of the planes of the selected second non-volatile memory array device.

In some embodiments, the functional device at least one bias voltage generator, at least one register, at least one automaton, and at least one buffer connected to the z-direction switch.

In some embodiments, the functional device is disposed between the first non-volatile memory array device and the second non-volatile memory array device.

In some embodiments, a layout of the first non-volatile memory array device is symmetric to a layout of the second non-volatile memory array device.

In some embodiments, the functional device is disposed above the first non-volatile memory array device and the second non-volatile memory array device.

In some embodiments, each of the first non-volatile memory array device and the second non-volatile memory array device includes a layer stack, a plurality of vertical channel structures, and a plurality of contacts. The layer stack includes a plurality of conductive layers and a plurality of insulating layers alternately arranged, wherein lengths of the conductive layers and the underlying insulating layers are sequentially decrease from bottom to top. The vertical channel structures are disposed in an array region of the layer stack. The contacts are disposed in a stair case region of the layer stack and are connected to the conductive layers.

In some embodiments, each of the first non-volatile memory array device and the second non-volatile memory array device includes a first connecting layer and a second connecting layer opposite to the first connecting layer. The second connecting layer includes a plurality of bonding pads bonded to the vertical channel structures and the contacts, respectively.

In some embodiments, the first connecting layer of the first non-volatile memory array device includes a plurality of power rails, and the first connecting layer of the second non-volatile memory array device includes a plurality of signal pads.

In some embodiments, a size of the power rails is greater than a size of the signal pads.

In some embodiments, each of the vertical channel structures includes a storage layer, an isolation pillar, a channel layer disposed between the storage layer and the isolation pillar, and a conductive plug disposed on the isolation pillar and in contact with the channel layer.

In some embodiments, the functional device is a non-volatile memory peripheral device, a processor device, a memory device, or a peripheral circuit and data processor device.

In some embodiments, the first non-volatile memory array device, the second non-volatile memory array device, and the functional device include wafers, chips, or combinations thereof.

In some embodiments, the three dimensional semiconductor device stack further includes an additional functional device disposed between or above the first non-volatile memory array device and the second non-volatile memory array device.

Another aspect of the disclosure provides a system having three dimensional semiconductor device stacks. The system includes a substrate, a plurality of aforementioned three dimensional semiconductor device stacks disposed on the substrate, a controller disposed on the substrate and electrically connected to the three dimensional semiconductor device stacks, a memory device disposed on the substrate and electrically connected to the three dimensional semiconductor device stacks, and an I/O interface disposed on the substrate and electrically connected to the three dimensional semiconductor device stacks.

In some embodiments, the substrate is an interposer substrate or a package substrate.

Another aspect of the disclosure provides a method of operating a three dimensional semiconductor device stack. The method includes applying a plurality of signals to an input of a z-direction switch of a functional device; selecting one of a first non-volatile memory array device and a second non-volatile memory array device to send the signals to by the z-direction switch; applying the signals to a plane switch of the functional device; and selecting one of a plurality of planes of the selected first non-volatile memory array device or selecting one of a plurality of planes of the selected second non-volatile memory array device by the plane switch.

In some embodiments, the method further includes sending the signals to the selected plane of the selected first non-volatile memory array device or the selected second non-volatile memory array device.

In some embodiments, the signals include voltage signals, address signals, command signals, state signals, and data signals.

In some embodiments, the first non-volatile memory array device, the second non-volatile memory array device, and the functional device are vertically stacked.

In some embodiments, the functional device is a non-volatile memory peripheral device, a processor device, a memory device, or a peripheral circuit and data processor device.

It is to be understood that both the foregoing general description and the following detailed description are by examples, and are intended to provide further explanation of the disclosure as claimed.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

FIG. 9 to FIG. 17 are schematic views of the non-volatile memory peripheral device of the three dimensional semiconductor device stack according to different embodiments of the disclosure.

DESCRIPTION OF THE EMBODIMENTS

Figure 1:
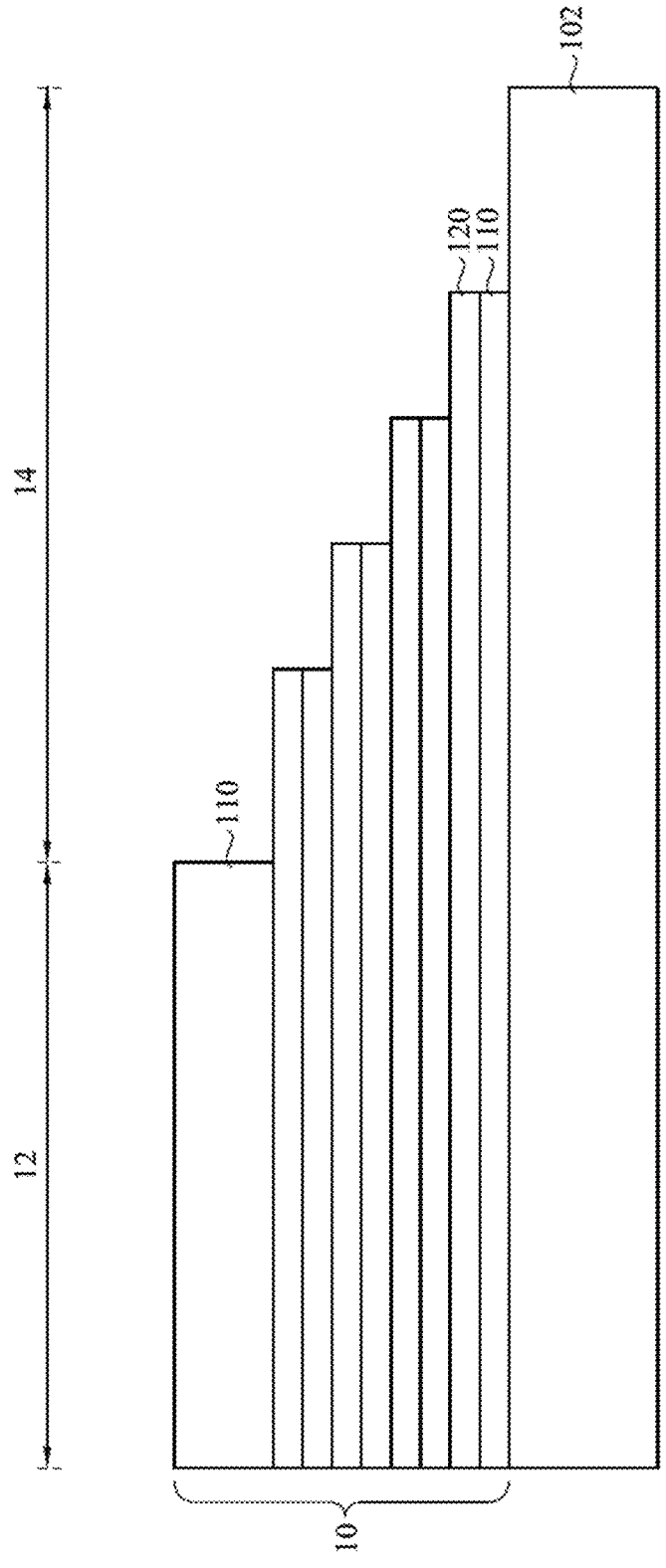
FIG. 1 to FIG. 5 are cross-sectional vires of different stages of a method of forming a non-volatile memory array device of a three dimensional semiconductor device stack according to some embodiments of the disclosure.

Reference will now be made in detail to the present embodiments of the disclosure, examples of which are illustrated in the accompanying drawings. Wherever possible, the same reference numbers are used in the drawings and the description to refer to the same or like parts.

Reference is made to FIG. 1 to FIG. 5, which are cross-sectional views of different stages of a method of forming a non-volatile memory array device of a three dimensional semiconductor device stack according to some embodiments of the disclosure. As shown in FIG. 1, a layer stack 10 including a plurality of insulating layers 110 and a plurality of sacrificial layers 120 alternately arranged are formed on a substrate 102 such as a silicon substrate. The layer stack 10 includes an array region 12 and a stair case region 14. The lengths of the sacrificial layers 120 and the underlying insulating layers 110 are sequentially decrease from bottom to top thereby forming the stair case region 14.

The material of the insulating layers 110 can be an oxide such as silicon oxide. The material of the sacrificial layers 120 is chosen to have suitable etching selectivity to the insulating layers 110. For example, the material of the sacrificial layers 120 can be nitride such as silicon nitride.

Figure 2:
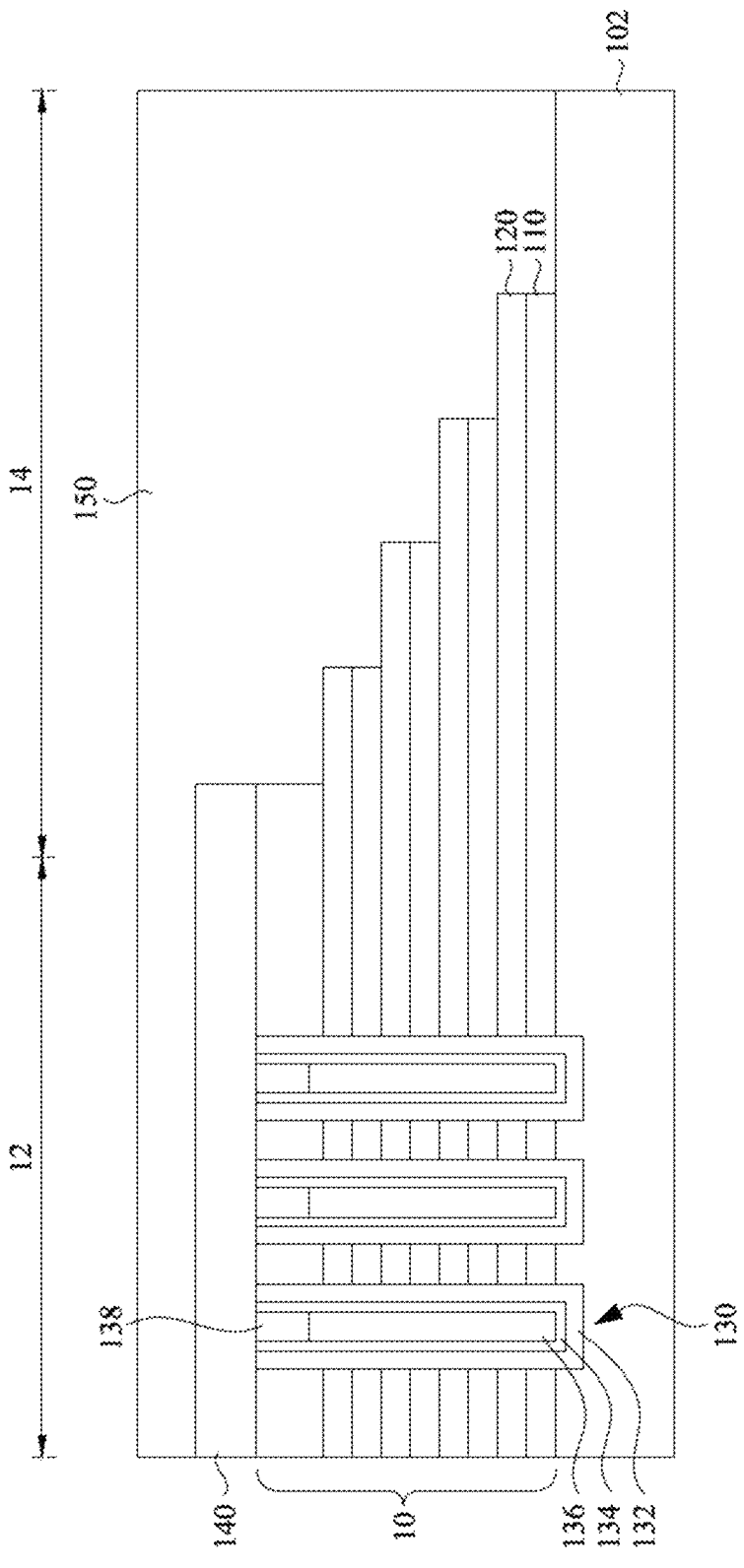

As shown in FIG. 2, a plurality of vertical channel structures 130 are formed in the array region 12 of the layer stack 10. Each of the vertical channel structures 130 includes a storage layer 132, a channel layer 134, and an isolation pillar 136. The channel layer 134 is sandwiched between the storage layer 132 and the isolation pillar 136. The storage layer 132 and the channel layer 134 have U-shaped cross-sections. In some embodiments, the storage layer 132 is a multi-layer structure, such as an oxide-nitride-oxide (ONO) layer that is able to trap electrons. The channel layer 134 may be made of a material including poly silicon, and the isolation pillar 136 may be made of dielectric material. Each of the vertical channel structures 130 further includes a conductive plug 138 disposed on the isolation pillar 136 and in contact with the channel layer 134. In some embodiments, the top surfaces of the conductive plug 138, the storage layer 132, the channel layer 134, and the topmost insulating layer 110 are substantially coplanar. The top surface of the isolation pillar 136 is below the top surface of the channel layer 134, and the sidewall of the conductive plug 138 is in contact with the channel layer 134.

A cap layer 140 is deposited on the vertical channel structures 130 and the topmost insulating layer 110 to seal the array region 12. A dielectric layer 150 is deposited over the cap layer 140 and the layer stack 10 including the array region 12 and the stair case region 14.

Figure 3:
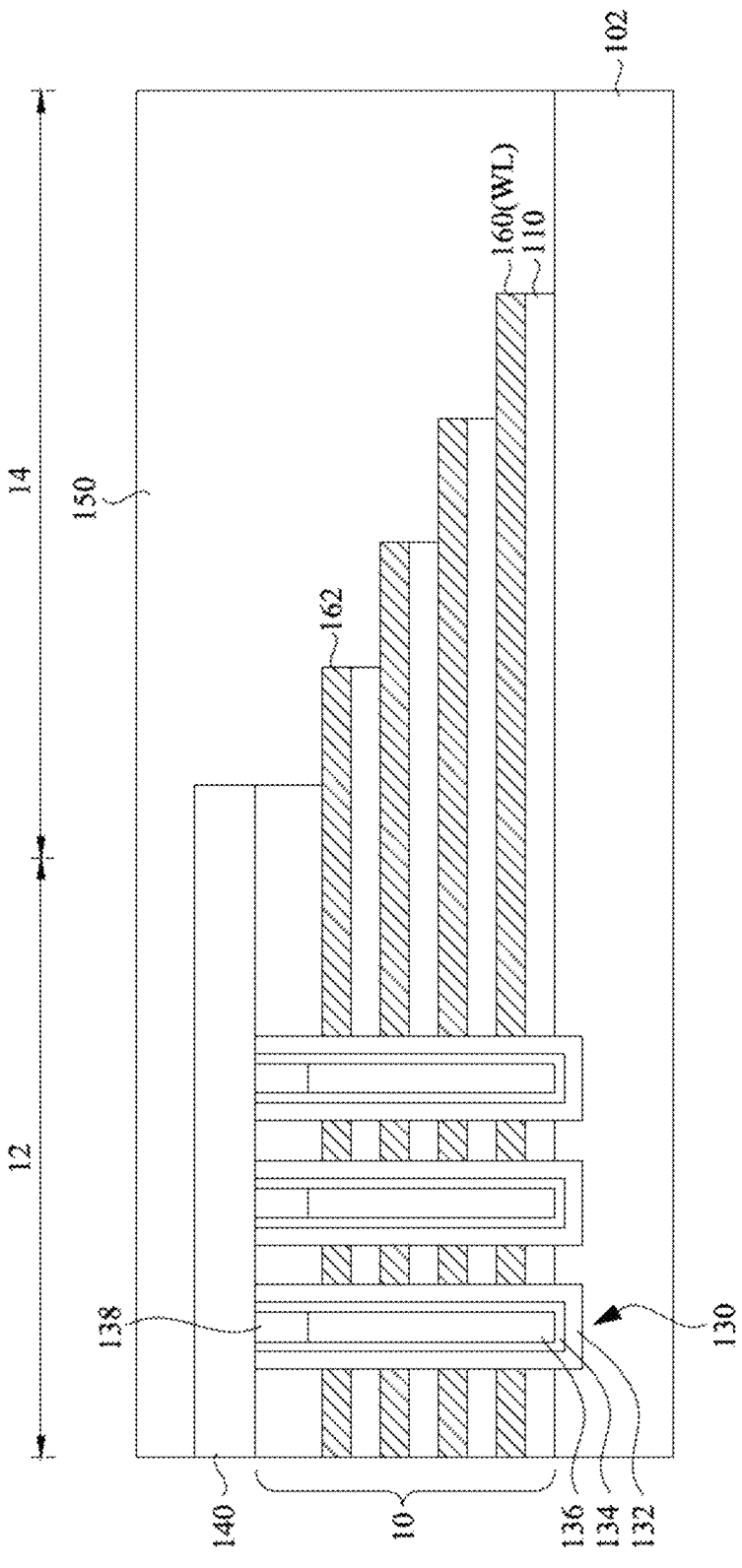

As shown in FIG. 3, the sacrificial layers 120 are replaced by a plurality of conductive layers 160. In some embodiments, the material of the conductive layers 160 can be metal such as tungsten. The conductive layers 160 serves as word lines WL to the vertical channel structures 130, and the conductive layers 160 at the stair case region 14 can be referred as landing pads 162.

Figure 4:
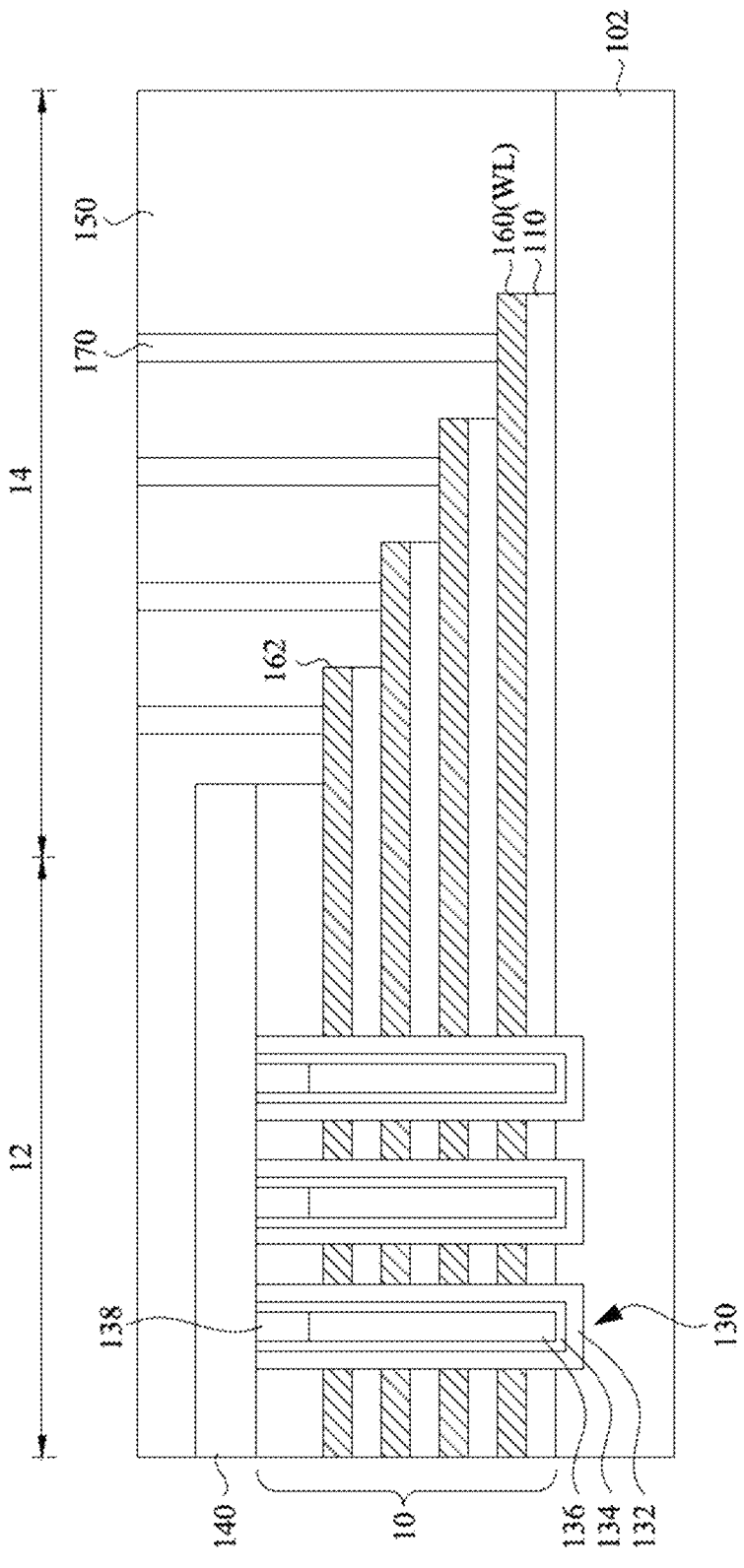

As shown in FIG. 4, a plurality of contacts 170 are formed to land on the stair case region 14. The contacts 170 are connected to the landing pads 162 of the conductive layers 160 at the stair case region 14, respectively. In some embodiments, the landing pads 162 at the stair case region 14 have a thicker thickness to ensure the electrical connection between the contacts 170 and the landing pads 162. The thicker landing pads 162 can also prevent from being unwanted punched through of the formation of the contacts 170.

Figure 5:
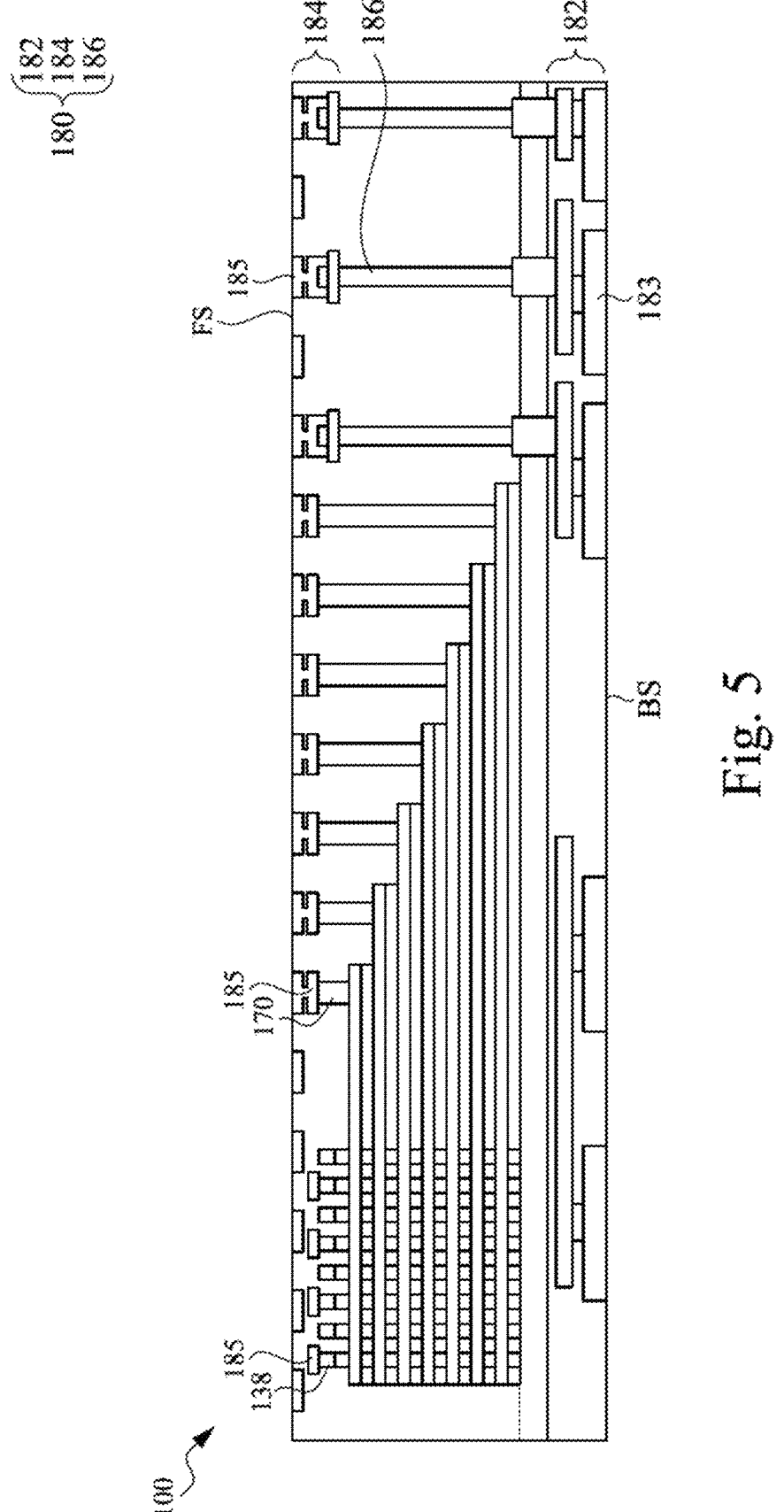

Then, as shown in FIG. 5, a planarization process is performed to expose the conductive plugs 138 of the vertical channel structures 130 (details thereof are shown in FIG. 4), and a connecting structure 180 is formed on at least one surface of the non-volatile memory array device 100. In some embodiments, the non-volatile memory array device 100 has a front side FS and a back side BS, and the connecting structure 180 includes a first connecting layer 182 at the back side BS and a second connecting layer 184 at the front side FS. The first connecting layer 182 has a plurality of pads 183 to connect to an external component through such as solder balls. The second connecting layer 184 has a plurality of bonding pads 185 to connect to an additional component. The bonding pads 185 are connected to the conductive plugs 138 and the contacts 170, respectively. The connecting structure 180 further includes a plurality of conductive pillars 186 to interconnect the first connecting layer 182 and the second connecting layer 184.

Traditionally, the peripheral components such as complementary metal-oxide-semiconductor (CMOS) components and other suitable circuits are disposed beneath the layer stack. However, due to the increasing density of the non-volatile memory device, the layers of the layer stack of the non-volatile memory device can be over hundreds of layers such as more than 500 layers. The layer stack in the non-volatile memory device includes the insulating layers and the sacrificial layers, the fabricating time and the yield loss such as warpage, stress imbalance, stacking issue, etc. of the non-volatile memory device would be increased when the number of the layers of layer stack is increased. The high aspect ratio and limited space for footprint also make the fabrication of the non-volatile memory device more difficult. The number and the length of the corresponding word lines are also greatly increased accordingly. Therefore, the resistances of the word lines are also increased. The present disclosure provides a three dimensional semiconductor device stack to solve above problems.

Figure 6:
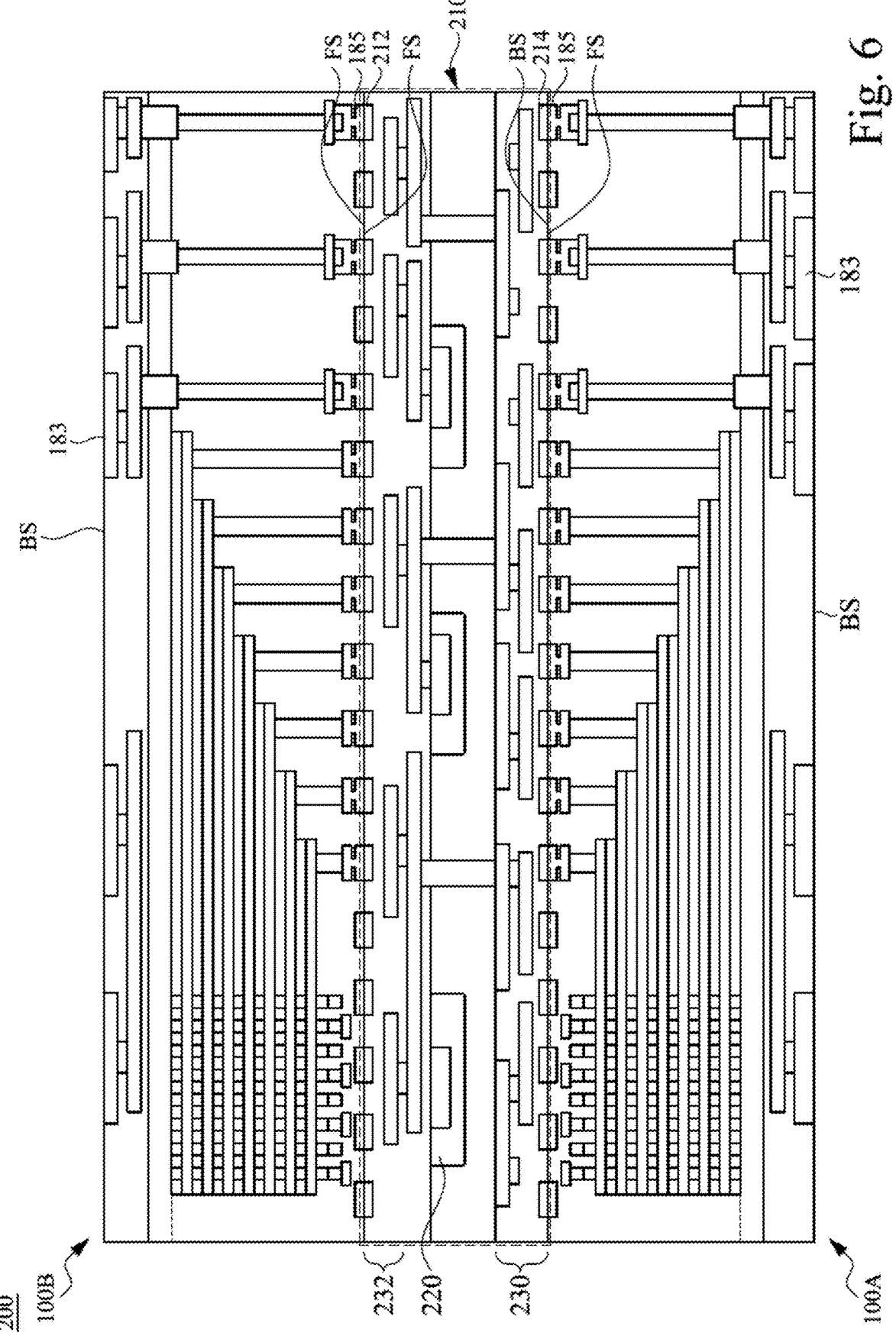
FIG. 6 is a cross-sectional view of a three dimensional semiconductor device stack according to some embodiments of the disclosure.

Reference is made to FIG. 6, which is a cross-sectional view of a three dimensional semiconductor device stack according to some embodiments of the disclosure. The three dimensional semiconductor device stack 200 includes a bottom non-volatile memory array device 100A, a top non-volatile memory array device 100B, and a functional device such as a non-volatile memory peripheral device 210 between the bottom non-volatile memory array device 100A and the top non-volatile memory array device 100B. The bottom non-volatile memory array device 100A and the top non-volatile memory array device 100B similar to the non-volatile memory array device 100 described above. In some embodiments, the bottom non-volatile memory array device 100A and the top non-volatile memory array device 100B are NAND array device. The bottom non-volatile memory array device 100A, the top non-volatile memory array device 100B, and the non-volatile memory peripheral device 210 can be semiconductor wafers, semiconductor chips, or combinations thereof.

In some embodiments, the non-volatile memory peripheral device 210 has a front side FS and a back side BS. The non-volatile memory peripheral device 210 includes a plurality of bonding pads 212 at the front side FS and a plurality of bonding pads 214 at the back side BS. The bonding pads 185 of the bottom non-volatile memory array device 100A are connected to the bonding pads 214 of the non-volatile memory peripheral device 210, so that the front side FS of the bottom non-volatile memory array device 100A is bonded to the back side BS of the non-volatile memory peripheral device 210. The bonding pads 185 of the top non-volatile memory array device 100B are connected to the bonding pads 212 of the non-volatile memory peripheral device 210, so that the front side FS of the top non-volatile memory array device 100B is bonded to the front side FS of the non-volatile memory peripheral device 210.

In some embodiments, the bonding method of the bottom non-volatile memory array device 100A, the non-volatile memory peripheral device 210, and the top non-volatile memory array device 100B can be a μ-bump bonding, a hybrid bonding, or any suitable bonding process. In some other embodiments, the front side FS of the non-volatile memory peripheral device 210 can be bonded to the back side BS of the top non-volatile memory array device 100B, or the back side BS of the non-volatile memory peripheral device 210 can be bonded to the back side BS of the bottom non-volatile memory array device 100A.

The non-volatile memory peripheral device 210 includes one or more CMOS components 220, a first redistribution layer 230 connecting the CMOS components 220 to the bonding pads 214 at the back side BS, a second redistribution layer 232 connecting the CMOS components 220 to the bonding pads 212 at the front side FS. In some embodiments, the pads of the CMOS components 220 are disposed at the same surface of the CMOS components 220, so that the first redistribution layer 230 and the second redistribution layer 232 are both connected to the same surface of the CMOS components 220.

The CMOS components 220 of the non-volatile memory peripheral device 210 are configured to operate both the bottom non-volatile memory array device 100A and the top non-volatile memory array device 100B. Comparing to conventional non-volatile memory device in which the CMOS components and the peripheral circuit are formed in the non-volatile memory array substrate, the number of the layers in each of the bottom non-volatile memory array device 100A and the top non-volatile memory array device 100B of the embodiments of the disclosure is half of the number of the layers in the conventional non-volatile memory device. Thus the fabricating time and the resistances of the word lines WL of the bottom non-volatile memory array device 100A and the top non-volatile memory array device 100B are reduced, and the yield loss of the three dimensional semiconductor device stack 200 is improved.

In some embodiments, the layout of the bottom non-volatile memory array device 100A is symmetric to the layout of the top non-volatile memory array device 100B when the front side FS of the bottom non-volatile memory array device 100A is bonded to the back side BS of the non-volatile memory peripheral device 210 and the front side FS of the top non-volatile memory array device 100B is bonded to the front side FS of the non-volatile memory peripheral device 210. The symmetric layouts of the bottom non-volatile memory array device 100A and the top non-volatile memory array device 100B can simplify the layout design.

Additionally, because the layouts of the bottom non-volatile memory array device 100A and the top non-volatile memory array device 100B are symmetric, the signal routes from the non-volatile memory peripheral device 210 to the bottom non-volatile memory array device 100A are the same as the signal routes from the non-volatile memory peripheral device 210 to the top non-volatile memory array device 100B. Therefore, IR drops at the corresponding positions of the bottom non-volatile memory array device 100A and the top non-volatile memory array device 100B would be the same which is benefit to signal control and processing.

In some embodiments, the back side BS of the top non-volatile memory array device 100B is connected to a signal source, and the back side BS of the bottom non-volatile memory array device 100A is connected to a power source. The signals are provided from the top non-volatile memory array device 100B to the non-volatile memory peripheral device 210, and the power is provided from the bottom non-volatile memory array device 100A to the non-volatile memory peripheral device 210. Therefore, the interference between the signals and power can be reduced, and the transmission paths of the signals and power can be simplified and optimized.

In some embodiments, the pads 183 at the back side BS of the bottom non-volatile memory array device 100A can serve as back side power rails. A power source is connected to the pads 183 at the back side BS of the bottom non-volatile memory array device 100A, such that power enters the bottom non-volatile memory array device 100A through the pads 183 and enters the non-volatile memory peripheral device 210 through the first redistribution layer 230. The power then goes to the CMOS components 220 of the non-volatile memory peripheral device 210. The power supply can be optimized.

Additionally, the pads 183 at the back side BS of the bottom non-volatile memory array device 100A have a larger size than the pads 183 at the back side BS of the top non-volatile memory array device 100B. The larger size back side power rails (e.g. the pads 183 at the back side BS of the bottom non-volatile memory array device 100A) have lower resistance and reduce the power loss.

Figure 7:
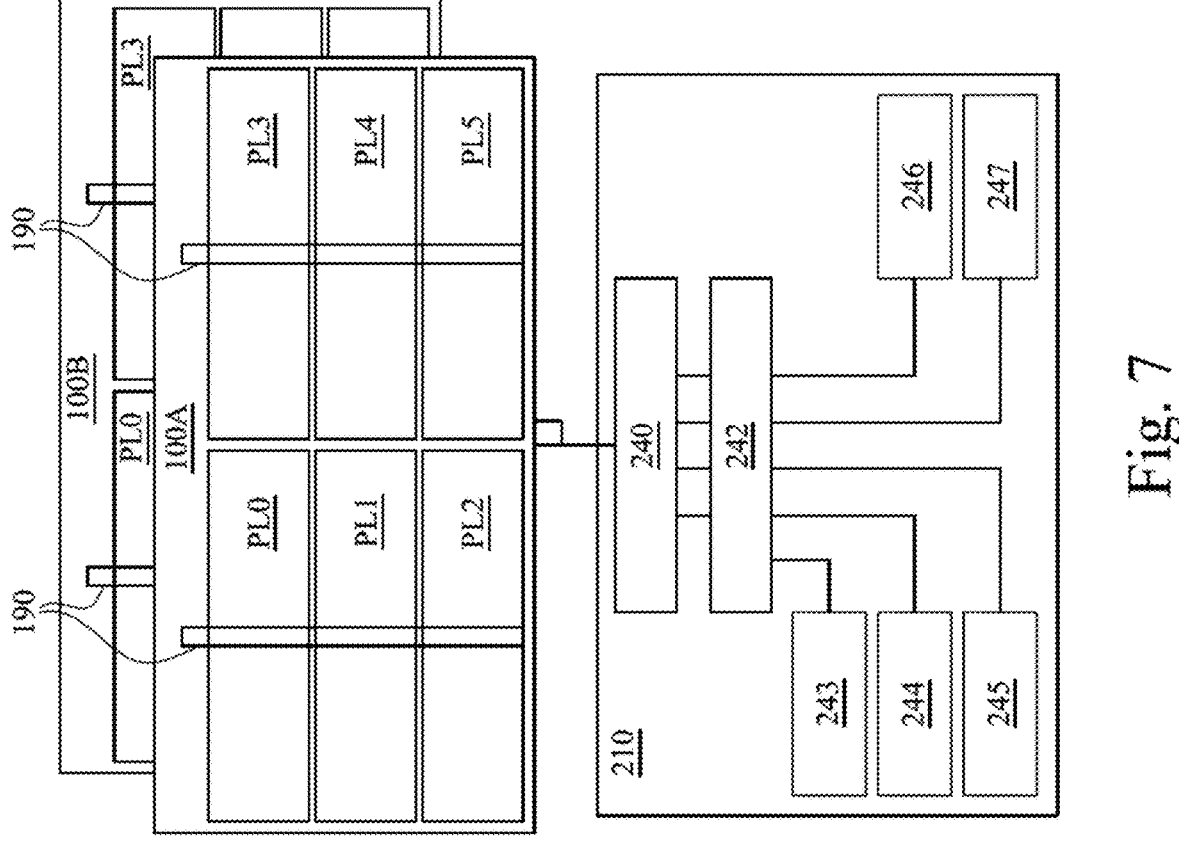
FIG. 7 is a schematic view diagram of the three dimensional semiconductor device stack according to some embodiments of the disclosure.

Reference is made to FIG. 7, which is a schematic view diagram of the three dimensional semiconductor device stack according to some embodiments of the disclosure. For example, each of the top non-volatile memory array device 100B and the bottom non-volatile memory array device 100A can be signally divided into a plurality of planes such as planes PL0-PL5. Each of the planes PL0-PL5 includes a memory array. The bottom non-volatile memory array device 100A and the top non-volatile memory array device 100B further include row decoders 190. The row decoders 190 are respectively associated with the corresponding planes PL0-PL5.

The non-volatile memory peripheral device 210 is electrically connected to the bottom non-volatile memory array device 100A and the top non-volatile memory array device 100B and is configured to select the planes PL0-PL5 and apply signals to the selected one of the planes PL0-PL5 of the bottom non-volatile memory array device 100A or the top non-volatile memory array device 100B.

In some embodiments, the non-volatile memory peripheral device 210 includes one or more plane switches 240, a z-direction switch 242 connected to the plane switch 240, a plurality of function units connected to the z-direction switch 242. The function units may include at least one bias voltage generator 243 such as a charge pumping. The function units may include at least one register 244 such as an address and command register. The function units may include at least one automaton 245 such as a finite state machine (FSM). The function units may include at least one buffer 246, 247 such as a data in buffer and a data out buffer. The combination of aforementioned function units is merely for an example and is not utilized to limit the implement of the disclosure.

Figure 8:
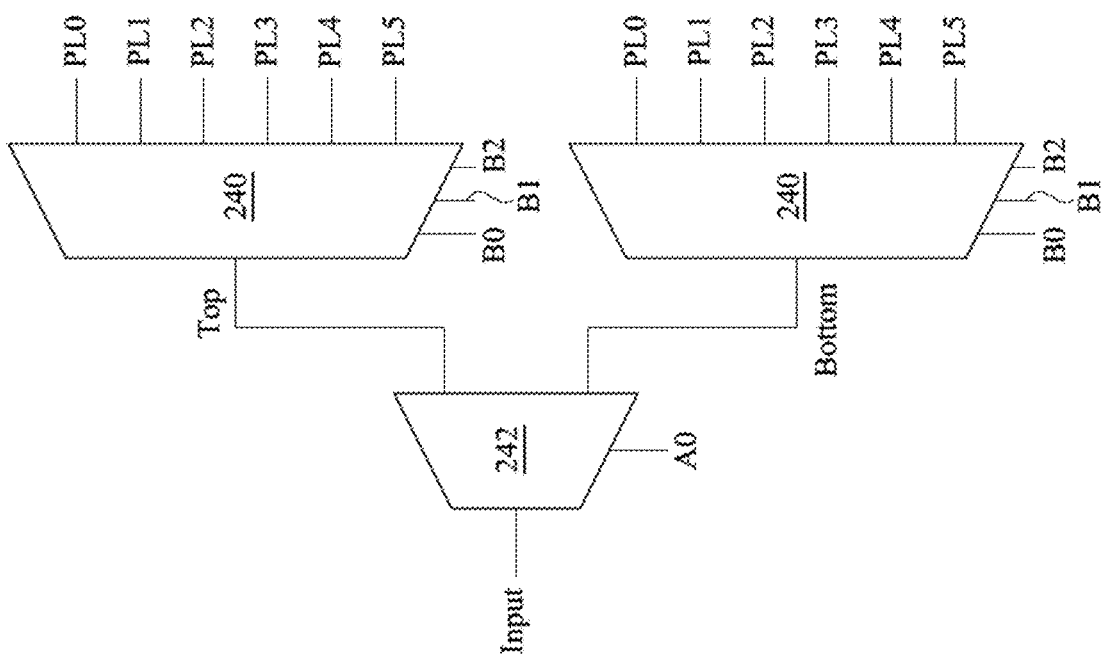
FIG. 8 is a circuit diagram of the non-volatile memory peripheral device of the three dimensional semiconductor device stack according to some embodiments of the disclosure.

Please refer to both FIG. 7 and FIG. 8, in which FIG. 8 is a circuit diagram of the non-volatile memory peripheral device of the three dimensional semiconductor device stack according to some embodiments of the disclosure. The method of operating the three dimensional semiconductor device stack includes following steps. The signals generated by the bias voltage generator 243, the register 244, the automaton 245, and the buffers 246, 247 are applied to the input of the z-direction switch 242. The signals include, but not limited to, voltage signals, address signals, command signals, state signals, and data signals. The z-direction switch 242 further selects one of the bottom non-volatile memory array device 100A and the top non-volatile memory array device 100B that the signals generated by the bias voltage generator 243, the register 244, the automaton 245, and the buffers 246, 247 are sent to. The select table of the z-direction switch 242 is provided below.

TABLE 1

| | | |
|---|---|---|
| select table of the z-direction switch | | |
| A0 | | non-volatile memory array device |
| 0 | | Top |
| 1 | | Bottom |

After the bottom non-volatile memory array device 100A or the top non-volatile memory array device 100B is selected, the signals generated by the bias voltage generator 243, the register 244, the automaton 245, and the buffers 246, 247 are applied to the selected plane switch 240. The selected plane switch 240 further selects one of the planes PL0-PL5 of the selected bottom non-volatile memory array device 100A or selects one of the planes PL0-PL5 of the top non-volatile memory array device 100B that the signals generated by the bias voltage generator 243, the register 244, the automaton 245, and the buffers 246, 247 are sent to. The select table of the plane switch 240 is provided below.

TABLE 2

| | | | |
|---|---|---|---|
| select table of the plane switch | | | |
| B0 | B1 | B2 | Plane |
| 0 | 0 | 0 | PL0 |
| 0 | 0 | 1 | PL1 |
| 0 | 1 | 0 | PL2 |
| 0 | 1 | 1 | PL3 |
| 1 | 0 | 0 | PL4 |
| 1 | 0 | 1 | PL5 |
| 1 | 1 | 0 | N/A |
| 1 | 1 | 1 | N/A |

Then the signals generated by the bias voltage generator 243, the register 244, the automaton 245, and the buffers 246, 247 are sent to the selected plane of the selected bottom non-volatile memory array device 100A or the selected plane of the selected top non-volatile memory array device 100B.

The three dimensional semiconductor device stack 200 including the z-direction switch 242 has a z-direction parallelism which can directly double the plane number and bandwidth. Additionally, the number of row decoders 190 of each of the bottom non-volatile memory array device 100A and the top non-volatile memory array device 100B is reduced. The bottom non-volatile memory array device 100A and the top non-volatile memory array device 100B share the non-volatile memory peripheral device 210 so that the footprint of the non-volatile memory peripheral device 210 can be reduced.

Reference is made to FIG. 9 to FIG. 17, which are schematic views of the non-volatile memory peripheral device of the three dimensional semiconductor device stack according to different embodiments of the disclosure. As shown in FIG. 9, the three dimensional semiconductor device stack 300A is a basic embodiment of the disclosure. The three dimensional semiconductor device stack 300A includes a first non-volatile memory array device 310, a second non-volatile memory array device 320, and a non-volatile memory peripheral device 330. Details of the first and second non-volatile memory array devices 310, 320 and the non-volatile memory peripheral device 330 are same as the embodiments disclosed above. The non-volatile memory peripheral device 330 is disposed between the first non-volatile memory array device 310 and the second non-volatile memory array device 320, and the first non-volatile memory array device 310 and the second non-volatile memory array device 320 share the non-volatile memory peripheral device 330.

In some other embodiments, as shown in FIG. 10, the three dimensional semiconductor device stack 300B includes a first non-volatile memory array device 310, a second non-volatile memory array device 320, and a peripheral circuit and processor device 340. The peripheral circuit and processor device 340 includes the peripheral CMOS components, processor units, and related circuits. The processor units of the peripheral circuit and processor device 340 are electrically coupling to the first non-volatile memory array device 310 and the second non-volatile memory array device 320. The first non-volatile memory array device 310 and the second non-volatile memory array device 320 share the peripheral circuit and processor device 340.

In some other embodiments, as shown in FIG. 11, the three dimensional semiconductor device stack 300C includes a first non-volatile memory array device 310, a second non-volatile memory array device 320, and a non-volatile memory peripheral device 330. The first non-volatile memory array device 310 is disposed on the non-volatile memory peripheral device 330, and the second non-volatile memory array device 320 is disposed on first non-volatile memory array device 310. The first non-volatile memory array device 310 and the second non-volatile memory array device 320 share the non-volatile memory peripheral device 330. The signals and power are communicated between the non-volatile memory peripheral device 330 and the second non-volatile memory array device 320 through the first non-volatile memory array device 310.

In some other embodiments, as shown in FIG. 12, the three dimensional semiconductor device stack 300D includes a first non-volatile memory array device 310, a second non-volatile memory array device 320, a non-volatile memory peripheral device 330, and a processor device 350. The non-volatile memory peripheral device 330 is disposed between the first non-volatile memory array device 310 and the second non-volatile memory array device 320. The processor device 350 is disposed between the first non-volatile memory array device 310 and the second non-volatile memory array device 320. The first non-volatile memory array device 310 and the second non-volatile memory array device 320 share the non-volatile memory peripheral device 330. The first non-volatile memory array device 310 and the second non-volatile memory array device 320 share the processor device 350.

Figures 13, 14, 15:
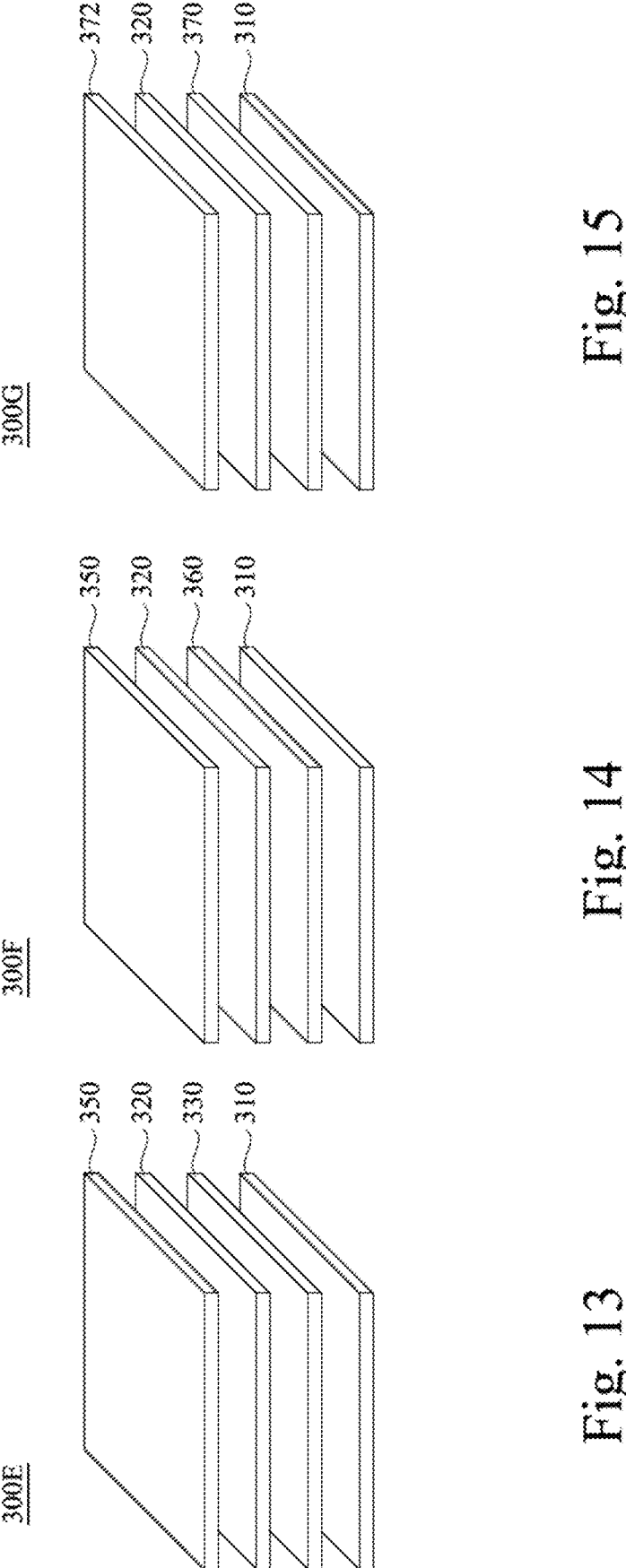

In some other embodiments, as shown in FIG. 13, the three dimensional semiconductor device stack 300E includes a first non-volatile memory array device 310, a second non-volatile memory array device 320, a non-volatile memory peripheral device 330, and a processor device 350. The non-volatile memory peripheral device 330 is disposed between the first non-volatile memory array device 310 and the second non-volatile memory array device 320. The processor device 350 is disposed above the first non-volatile memory array device 310 and the second non-volatile memory array device 320. The first non-volatile memory array device 310 and the second non-volatile memory array device 320 share the non-volatile memory peripheral device 330. The first non-volatile memory array device 310 and the second non-volatile memory array device 320 share the processor device 350.

In some other embodiments, as shown in FIG. 14, the three dimensional semiconductor device stack 300F includes a first non-volatile memory array device 310, a second non-volatile memory array device 320, a peripheral circuit and data processor device 360, and a processor device 350. The peripheral circuit and data processor device 360 is disposed between the first non-volatile memory array device 310 and the second non-volatile memory array device 320. The processor device 350 is disposed above the first non-volatile memory array device 310 and the second non-volatile memory array device 320. The first non-volatile memory array device 310 and the second non-volatile memory array device 320 share the peripheral circuit and data processor device 360. The first non-volatile memory array device 310 and the second non-volatile memory array device 320 share the processor device 350.

In some other embodiments, as shown in FIG. 15, the three dimensional semiconductor device stack 300G includes a first non-volatile memory array device 310, a second non-volatile memory array device 320, a first peripheral device 370, and a second peripheral device 372. The first peripheral device 370 is disposed between the first non-volatile memory array device 310 and the second non-volatile memory array device 320. The second peripheral device 372 is disposed above the first non-volatile memory array device 310 and the second non-volatile memory array device 320.

Figures 16, 17:
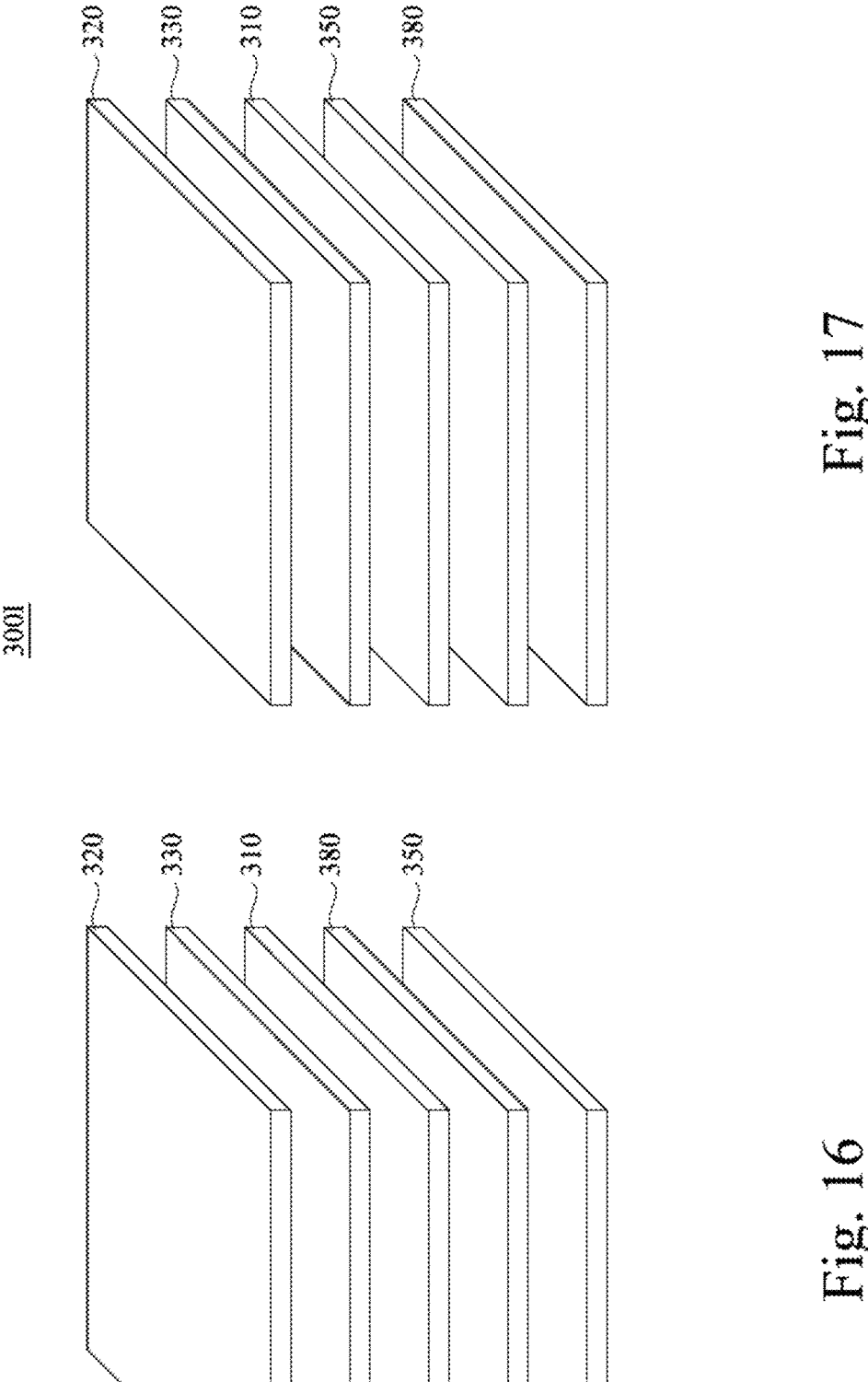

In some other embodiments, as shown in FIG. 16, the three dimensional semiconductor device stack 300H includes a first non-volatile memory array device 310, a second non-volatile memory array device 320, a non-volatile memory peripheral device 330, a processor device 350, and a memory device 380. The memory device 380 is disposed on the processor device 350, the first non-volatile memory array device 310 is disposed on the memory device 380, the non-volatile memory peripheral device 330 is disposed on the first non-volatile memory array device 310, and the second non-volatile memory array device 320 is disposed on the non-volatile memory peripheral device 330. The first non-volatile memory array device 310 and the second non-volatile memory array device 320 share the non-volatile memory peripheral device 330. The first non-volatile memory array device 310, the second non-volatile memory array device 320, and the memory device 380 share the processor device 350.

In some other embodiments, as shown in FIG. 17, the three dimensional semiconductor device stack 300I includes a first non-volatile memory array device 310, a second non-volatile memory array device 320, a non-volatile memory peripheral device 330, a processor device 350, and a memory device 380. The processor device 350 is disposed on the memory device 380, the first non-volatile memory array device 310 is disposed on the processor device 350, the non-volatile memory peripheral device 330 is disposed on the first non-volatile memory array device 310, and the second non-volatile memory array device 320 is disposed on the non-volatile memory peripheral device 330. The first non-volatile memory array device 310 and the second non-volatile memory array device 320 share the non-volatile memory peripheral device 330. The first non-volatile memory array device 310, the second non-volatile memory array device 320, and the memory device 380 share the processor device 350.

According to the embodiments discussed in FIG. 9 to FIG. 17, the three dimensional semiconductor device stacks not only provide storage function, but also provide function such as computing, accelerator, etc. The three dimensional semiconductor device stack includes more than one non-volatile memory array devices to enhance the storage density. The aforementioned non-volatile memory array device, non-volatile memory peripheral device, peripheral circuit and processor device, processor device, memory device, peripheral circuit and data processor device can be wafers, chips, or combinations thereof, and each chip or wafer for every function is placed one or more than one.

Figure 18:
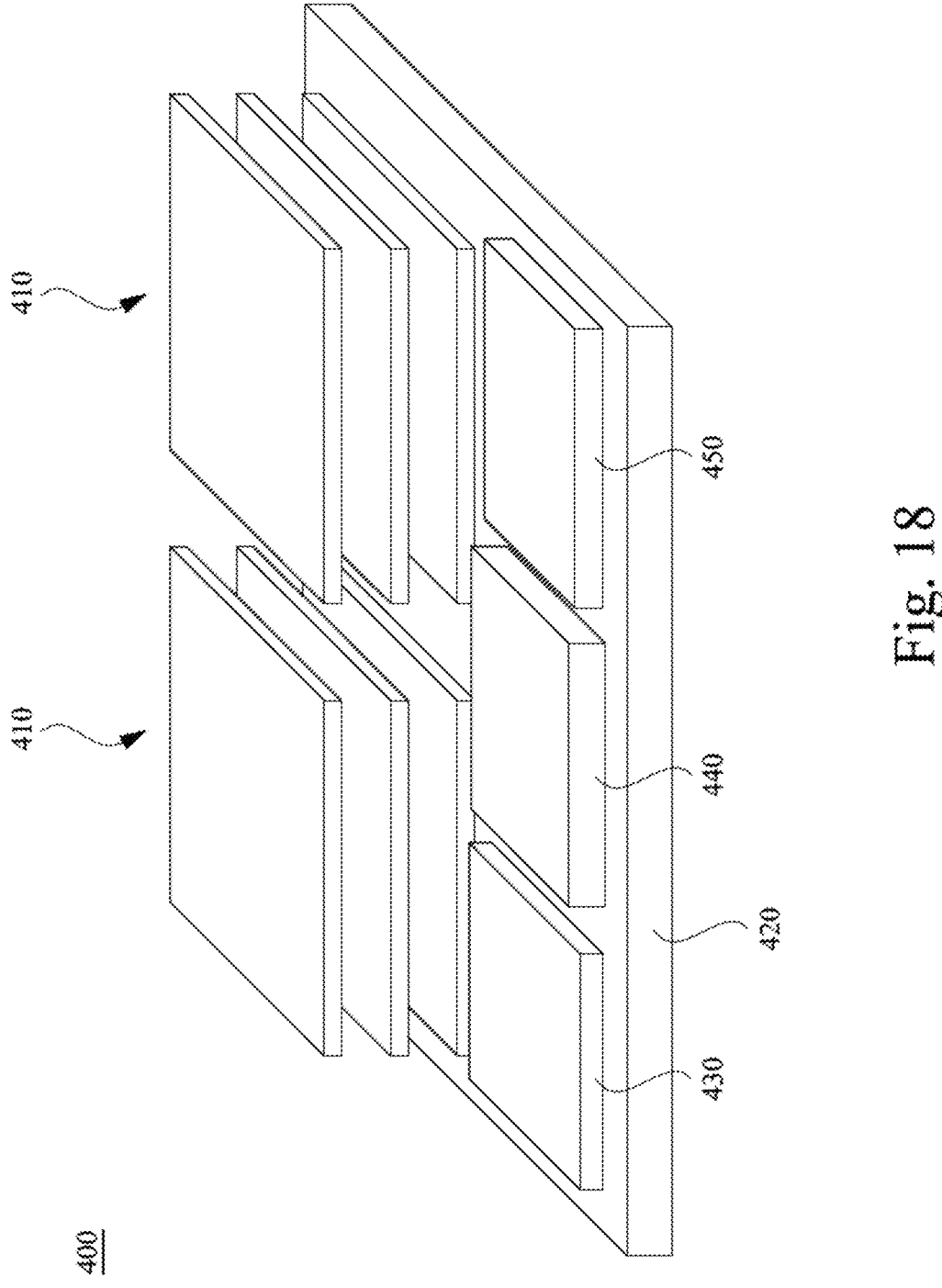
FIG. 18 is a schematic view of a system having three dimensional semiconductor device stacks according to some embodiments of the disclosure.

Reference is made to FIG. 18. FIG. 18 is a schematic view of a system having three dimensional semiconductor device stacks according to some embodiments of the disclosure. In some embodiments, the system 400 may include more than one three dimensional semiconductor device stacks 410 disposed on a substrate 420. The three dimensional semiconductor device stacks 410 can be any suitable combinations of the three dimensional semiconductor device stacks as described in FIG. 9 to FIG. 17. The substrate 420 can be an interposer substrate or a package substrate. The system 400 may further include additional devices such as a memory device 430, a controller 440, and an I/O interface 450 disposed on the substrate 420 and electrically connected to the three dimensional semiconductor device stacks 410.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A three dimensional semiconductor device stack comprising:
   a first non-volatile memory array device comprising a plurality of planes;
   a second non-volatile memory array device comprising a plurality of planes; and
   a functional device electrically connecting to the first non-volatile memory array device and the second non-volatile memory array device, wherein the functional device comprises:
   a z-direction switch configured to select one of the first non-volatile memory array device and the second non-volatile memory array device;
   at least one bias voltage generator, at least one register, at least one automaton, and at least one buffer connected to the z-direction switch; and
   a plane switch configured to select one of the planes of the selected first non-volatile memory array device or to select one of the planes of the selected second non-volatile memory array device.

2. The three dimensional semiconductor device stack of claim 1, wherein the functional device is disposed between the first non-volatile memory array device and the second non-volatile memory array device.

3. The three dimensional semiconductor device stack of claim 2, wherein a layout of the first non-volatile memory array device is symmetric to a layout of the second non-volatile memory array device.

4. The three dimensional semiconductor device stack of claim 1, wherein the functional device is disposed above the first non-volatile memory array device and the second non-volatile memory array device.

5. The three dimensional semiconductor device stack of claim 4, wherein each of the first non-volatile memory array device and the second non-volatile memory array device comprises:
   a layer stack comprising a plurality of conductive layers and a plurality of insulating layers alternately arranged, wherein lengths of the conductive layers and the underlying insulating layers are sequentially decrease from bottom to top;
   a plurality of vertical channel structures disposed in an array region of the layer stack; and
   a plurality of contacts disposed in a stair case region of the layer stack and connected to the conductive layers.

6. The three dimensional semiconductor device stack of claim 5, wherein each of the first non-volatile memory array device and the second non-volatile memory array device comprises:
   a first connecting layer; and
   a second connecting layer disposed opposite to the first connecting layer and comprising a plurality of bonding pads bonded to the vertical channel structures and the contacts, respectively.

7. The three dimensional semiconductor device stack of claim 6, wherein the first connecting layer of the first non-volatile memory array device comprises a plurality of power rails, and the first connecting layer of the second non-volatile memory array device comprises a plurality of signal pads.

8. The three dimensional semiconductor device stack of claim 7, wherein a size of the power rails is greater than a size of the signal pads.

9. The three dimensional semiconductor device stack of claim 5, wherein each of the vertical channel structures comprises:
   a storage layer;
   an isolation pillar;
   a channel layer disposed between the storage layer and the isolation pillar; and
   a conductive plug disposed on the isolation pillar and in contact with the channel layer.

10. The three dimensional semiconductor device stack of claim 1, wherein the functional device is a non-volatile memory peripheral device, a processor device, a memory device, or a peripheral circuit and data processor device.

11. The three dimensional semiconductor device stack of claim 1, wherein the first non-volatile memory array device, the second non-volatile memory array device, and the functional device comprise wafers, chips, or combinations thereof.

12. The three dimensional semiconductor device stack of claim 1, further comprising an additional functional device disposed between or above the first non-volatile memory array device and the second non-volatile memory array device.

13. A system having three dimensional semiconductor device stacks, the system comprising:
   a substrate, wherein the substrate is an interposer substrate or a package substrate;
   a plurality of three dimensional semiconductor device stacks disposed on the substrate, wherein each of the plurality of three dimensional semiconductor device stacks comprises:
   a first non-volatile memory array device comprising a plurality of planes;
   a second non-volatile memory array device comprising a plurality of planes; and
   a functional device electrically connecting to the first non-volatile memory array device and the second non-volatile memory array device, wherein the functional device comprises:
   a z-direction switch configured to select one of the first non-volatile memory array device and the second non-volatile memory array device; and a plane switch configured to select one of the planes of the selected first non-volatile memory array device or to select one of the planes of the selected second non-volatile memory array device;

a controller disposed on the substrate and electrically connected to the plurality of three dimensional semiconductor device stacks;

a memory device disposed on the substrate and electrically connected to the plurality of three dimensional semiconductor device stacks; and an I/O interface disposed on the substrate and electrically connected to the plurality of three dimensional semiconductor device stacks.

14. The system of claim 13, wherein the controller is configured to operate following steps:

applying a plurality of signals to an input of the z-direction switch of the functional device;

selecting one of the first non-volatile memory array device and the second non-volatile memory array device to send the signals to by the z-direction switch;

applying the signals to the plane switch of the functional device; and selecting one of the plurality of planes of the selected first non-volatile memory array device or selecting one of the plurality of planes of the selected second non-volatile memory array device by the plane switch.

15. The system of claim 14, wherein the controller is configured to send the signals to the selected plane of the selected first non-volatile memory array device or the selected second non-volatile memory array device.

16. The system of claim 14, wherein the signals comprise voltage signals, address signals, command signals, state signals, and data signals.

17. The system of claim 13, wherein the first non-volatile memory array device, the second non-volatile memory array device, and the functional device are vertically stacked.

18. A system having three dimensional semiconductor device stacks, the system comprising:

a substrate;

a plurality of three dimensional semiconductor device stacks disposed on the substrate, wherein each of the plurality of three dimensional semiconductor device stacks comprises:

a first non-volatile memory array device comprising a plurality of planes;

a second non-volatile memory array device comprising a plurality of planes; and a functional device electrically connecting to the first non-volatile memory array device and the second non-volatile memory array device, wherein the functional device comprises:

a z-direction switch configured to select one of the first non-volatile memory array device and the second non-volatile memory array device;

at least one bias voltage generator, at least one register, at least one automaton, and at least one buffer connected to the z-direction switch; and a plane switch configured to select one of the planes of the selected first non-volatile memory array device or to select one of the planes of the selected second non-volatile memory array device;

a controller disposed on the substrate and electrically connected to the plurality of three dimensional semiconductor device stacks;

a memory device disposed on the substrate and electrically connected to the plurality of three dimensional semiconductor device stacks; and an I/O interface disposed on the substrate and electrically connected to the plurality of three dimensional semiconductor device stacks.

19. A system having three dimensional semiconductor device stacks, the system comprising:

a substrate;

a plurality of three dimensional semiconductor device stacks disposed on the substrate, wherein each of the plurality of three dimensional semiconductor device stacks comprises:

a first non-volatile memory array device comprising a plurality of planes;

a second non-volatile memory array device comprising a plurality of planes, wherein each of the first non-volatile memory array device and the second non-volatile memory array device comprises:

a layer stack comprising a plurality of conductive layers and a plurality of insulating layers alternately arranged, wherein lengths of the conductive layers and the underlying insulating layers are sequentially decrease from bottom to top;

a plurality of vertical channel structures disposed in an array region of the layer stack; and a plurality of contacts disposed in a stair case region of the layer stack and connected to the conductive layers; and a functional device electrically connecting to the first non-volatile memory array device and the second non-volatile memory array device and disposed above the first non-volatile memory array device and the second non-volatile memory array device, wherein the functional device comprises:

a z-direction switch configured to select one of the first non-volatile memory array device and the second non-volatile memory array device; and a plane switch configured to select one of the planes of the selected first non-volatile memory array device or to select one of the planes of the selected second non-volatile memory array device;

a controller disposed on the substrate and electrically connected to the plurality of three dimensional semiconductor device stacks;

a memory device disposed on the substrate and electrically connected to the plurality of three dimensional semiconductor device stacks; and an I/O interface disposed on the substrate and electrically connected to the plurality of three dimensional semiconductor device stacks.

* * * * *